United States Patent
De et al.

(10) Patent No.: US 11,467,851 B1
(45) Date of Patent: Oct. 11, 2022

(54) MACHINE LEARNING (ML)-BASED STATIC VERIFICATION FOR DERIVED HARDWARE-DESIGN ELEMENTS

(71) Applicant: Synopsys, Inc., Mountain View, CA (US)

(72) Inventors: Kaushik De, Pleasanton, CA (US); Rajarshi Mukherjee, San Jose, CA (US); Paras Mal Jain, Cupertino, CA (US); David L. Allen, Fremont, CA (US)

(73) Assignee: SYNOPSYS, INC., Mountain View, CA (US)

( * ) Notice: Subject to any disclaimer, the term of this patent is extended or adjusted under 35 U.S.C. 154(b) by 64 days.

(21) Appl. No.: 17/100,625

(22) Filed: Nov. 20, 2020

Related U.S. Application Data

(60) Provisional application No. 62/938,663, filed on Nov. 21, 2019.

(51) Int. Cl.
| | |
|---|---|
| *G06F 9/445* | (2018.01) |
| *G06F 30/33* | (2020.01) |
| *G06N 20/00* | (2019.01) |
| *G06F 30/20* | (2020.01) |

(52) U.S. Cl.
CPC .......... *G06F 9/44505* (2013.01); *G06F 30/20* (2020.01); *G06N 20/00* (2019.01)

(58) Field of Classification Search
CPC ...... G06F 9/44505; G06F 30/20; G06F 30/33; G06N 20/00
USPC ......................................................... 713/100
See application file for complete search history.

(56) References Cited

U.S. PATENT DOCUMENTS

| | | | | |
|---|---|---|---|---|
| 5,703,788 A | * | 12/1997 | Shei ........................ | G06F 11/22 716/102 |
| 6,269,467 B1 | * | 7/2001 | Chang ..................... | G06F 30/33 716/136 |
| 2002/0032894 A1 | * | 3/2002 | Miyazaki ................ | G06F 30/30 716/105 |
| 2004/0024298 A1 | * | 2/2004 | Marshik-Geurts ... | A61B 5/0075 600/326 |
| 2014/0335831 A1 | * | 11/2014 | Lamberton ......... | H04W 12/126 455/411 |
| 2014/0372986 A1 | * | 12/2014 | Levin .................. | G06F 9/44589 717/126 |

(Continued)

*Primary Examiner* — Paul R. Myers

(57) ABSTRACT

Disclosed herein are system, computer-readable storage medium, and method embodiments of machine-learning (ML)-based static verification for derived hardware-design elements. A system including at least one processor may be configured to extract a feature set from a hardware description and evaluate a similarity index of a first hardware element with respect to a second hardware element, using an ML process based on the feature set, wherein the first hardware element is described in the hardware description. The at least one processor may be further configured to update one or more parameters corresponding to a static verification of the hardware description while the static verification is being performed, by providing at least one test attribute, corresponding to the second hardware element, applicable to the first hardware element, in response to determining that the similarity index is within a specified range, and additionally output a first result of the static verification.

20 Claims, 8 Drawing Sheets

(56) References Cited

U.S. PATENT DOCUMENTS

| | | | |
|---|---|---|---|
| 2017/0168112 A1* | 6/2017 | Redburn | G01R 31/3177 |
| 2018/0035307 A1* | 2/2018 | Mahimkar | H04L 43/08 |
| 2019/0213288 A1* | 7/2019 | Bhowmick | G06N 20/00 |
| 2021/0304072 A1* | 9/2021 | Kalra | G06Q 30/0277 |

* cited by examiner

600

Check at least one corresponding signature of at least one attribute of the at least one hardware element described in the hardware description with respect to a known signature of at least one known attribute of the second hardware element, the second hardware element corresponding to at least one known hardware element referenced in a database or other hardware element described in the hardware description
602

Omit from the extracting, the evaluating, or the static verification, a given hardware element of the at least one hardware element the hardware description, wherein a given signature of the given hardware element at least partially matches the known signature of the at least one known attribute of the second hardware element, in response to 602
604

FIG. 6

MACHINE LEARNING (ML)-BASED STATIC VERIFICATION FOR DERIVED HARDWARE-DESIGN ELEMENTS

TECHNICAL FIELD

The present disclosure relates to an electronic design automation (EDA) system. In particular, the present disclosure is related to a system and method for providing machine learning (ML)-based static verification for derived hardware-design elements.

BACKGROUND

Typical circuit designs (e.g., for integrated circuits or programmable logic) may be created by using functional blocks (also referred to as intellectual properties (IPs)) and/or making modifications of designs of existing IP designs to create derivative versions of the existing designs.

A static verification tool, such as a linter, a checker for clock-domain crossings (CDC), reset-domain crossings (RDC), low-power (LP) specification violations, and other formal verification tools, may perform static verification of any given hardware design for signoff (e.g., completing verification before a tape-out process with electronic design automation (EDA)) for a given hardware-design project. In any steps of static verification using any of tools such as those listed above, a user may analyze any violations and decide to take actions to address violations.

Apart from changing the underlying design itself in an attempt to avoid violations, the static verification tool may also address a violation by performing specific actions, such as changing tool settings, specifying constraints for the static verification, and/or applying waivers for certain violations that a user may not need or want to address by other means. Once addressed, verification steps may be repeated until verification passes.

When another derivative version of the same design is run through the same static-verification tool, the static verification typically starts from scratch each time. This may be because different design groups, possibly in different locations, may separately work on the same designs or new designs derived therefrom. The derivative designs may have many parts left unchanged, in common with the existing design, with only some parts being new or modified. Any parameters that may have been set or learned from static-verification actions performed for previous version of the design may go ignored due to the user manually managing verification, and conventional migration of any previous settings may still underutilize specific constraints, settings, or waivers with respect to any hardware-design elements that may be reused or derived from existing designs.

Thus, even where designs may be reused, learning is not easily reused or reusable across runs of static-verification tools. This lack of reuse of learning may result in inefficient usage of human resources and compute resources to reach to same or similar actions. Additionally, such inefficiencies may in turn risk missing out on certain actions that may improve design reliability and that may thus jeopardize the fidelity of a signoff for a given circuit or hardware project.

SUMMARY

Disclosed herein are system, computer-readable storage medium, and method embodiments of ML-based static verification for derived hardware-design elements. A system including at least one processor may be configured to extract a feature set from a hardware description and evaluate a similarity index of a first hardware element with respect to a second hardware element, using an ML process based on the feature set, where the first hardware element is described in the hardware description.

The at least one processor may be further configured to update one or more parameters corresponding to a static verification of the hardware description while the static verification is being performed, by providing at least one test attribute, corresponding to the second hardware element, applicable to the first hardware element, in response to determining that the similarity index is within a specified range, and additionally output a first result of the static verification with respect to at least one hardware element described in the hardware description, in an embodiment.

The feature set may be based at least in part on the at least one test attribute corresponding to one or more hardware elements of the hardware description. Moreover, the at least one test attribute may include a configuration, a setting, a constraint, or a waiver of one or more violations of a specification for the static verification. Additionally, at least one attribute of the first hardware element is propagated to at least one other hardware element in a hierarchy of hardware elements described in the hardware description and for which the similarity index is within the specified range, according to some further embodiments.

Additionally, or alternatively, the present disclosure further includes operations of checking at least one corresponding signature of at least one attribute of the at least one hardware element described in the hardware description with respect to a known signature of at least one known attribute of the second hardware element. The second hardware element may correspond to at least one known hardware element referenced in a database or at least one other hardware element described in the hardware description. A further operation may include, in response to the checking, omitting from the extracting, the evaluating, or the static verification, a given hardware element of the at least one hardware element the hardware description, when a given signature of the given hardware element at least partially matches the known signature of the at least one known attribute of the second hardware element, according to some embodiments of the present disclosure.

Additionally, or alternatively, the present disclosure further includes operations of identifying a specification for the static verification, and indicating, based at least in part on the similarity index and on the specification, that a first attribute of the first hardware element is similar to a second attribute of the second hardware element. Further operations may include retrieving a second result of an additional static verification with respect to the second hardware element and the specification, using the second attribute instead of the first attribute, and returning the second result as the first result with respect to the first hardware element.

At least some aspects of this summary, among other aspects of the present disclosure, may be implemented via various system, apparatus, article of manufacture, method and/or computer program product embodiments, and/or combinations and sub-combinations thereof, for using technology in innovative ways to enable ML-based static verification for derived hardware elements.

BRIEF DESCRIPTION OF THE DRAWINGS

The disclosure will be understood more fully from the detailed description given below and from the accompanying figures of embodiments of the disclosure. The figures are

FIG. 6 illustrates a flowchart of a further example method of static verification in addition to that shown in FIG. 5, according to some embodiments of the present disclosure.

In the drawings, like reference numbers generally indicate identical or similar elements.

DETAILED DESCRIPTION

Figure 1:
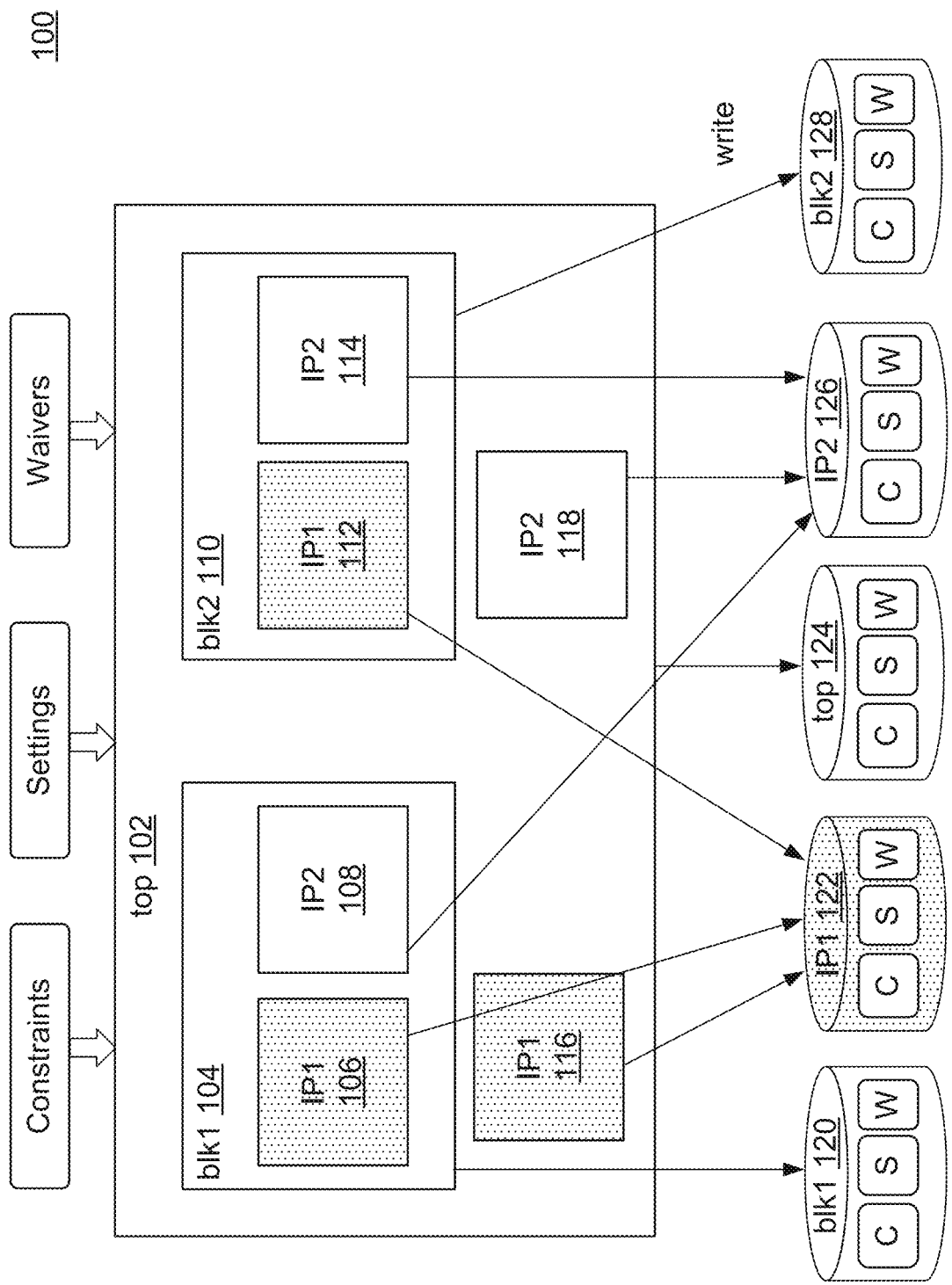
FIG. 1 illustrates saving of constraints, settings, and waivers for various design levels, according to some embodiments of the present disclosure.

Aspects of the present disclosure relate to ML-based static verification for derived hardware-design elements. Further aspects of the present disclosure relate to static verification of hardware designs, such as those compiled from hardware-description languages (HDL) or other higher-level representations. More specifically, the present disclosure further describes, according to some embodiments, ML and related processes and techniques that may be applied to enhance accuracy, speed, and efficiency of such static verification.

Hardware designs may include various hardware-design elements, for which various parameters in testing tools may be configured and adjusted when hardware designs are tested, such as with static verification against various specifications. Examples of such parameters include tool switches (e.g., app_vars), to run a tool in a certain mode or to control various aspects of how the tool runs a given test for any applicable part of a DUT. For example, setting a parameter of case_analysis may assume a constant value for a set of design nodes (e.g., hardware-design elements) and propagate these constant values appropriately to other nodes in the DUT, in order to run a test tool with these assumed constants. Assumed constants, as opposed to design constants, may be set by control logic during hardware operation as it would run under such logic controls, test tools may be run under assumption of these constants, in some embodiments.

For purposes of the present disclosure, with any given hardware-design element, any special settings of parameters for a run of a test tool may be generally referred to as test attributes. Some examples of test attributes include constraints, settings, and waivers, according to some embodiments. An example of the present techniques described herein includes recording at a time when a given test is being performed (e.g., using a specific linter, checker, or similar static-verification routine), constraints that a user or other entity may set for purposes of the given test (e.g., selecting or excluding quasi_static or case_analysis parameters, to provide a few non-limiting example parameters that may be treated as constraint attributes), settings, modes, or other configuration options a user may be using or may have otherwise set for the given test (e.g., any specific app_vars, or other variables for tool configurations), and/or any waivers that a user or other entity may apply during or after verification, such as to ignore or eliminate certain violations from consideration if permissible when proceeding to a subsequent step of a design or test phase for a given circuit or hardware project, according to some embodiments. Additionally, or alternatively, the above recording of test attributes (e.g., a constraint, a setting, and a waiver), may be recorded as actions (e.g., of setting or unsetting) rather than as the attributes' configuration values per se, for example, per some embodiments.

Such recordings may also be propagated (e.g., ported, moved over, pushed down) to additional levels of a design hierarchy (e.g., from system-on-a-chip (SoC) level to chiplet level or other IP level). Moreover, further recordings as propagated or inherited may be made attributable to those corresponding design blocks, again either as configuration values of test attributes (e.g., a constraint, a setting, and a waiver) and/or as test actions themselves. Even if an entire project design is not reused as a whole, parts of the design may be reused, and may thus benefit from inheriting applicable attributes in this way.

For example, if a SoC signal is marked as set case_analysis=1 for a given test (constituting a case_analysis constraint to assume a '1' value for a given signal in a DUT), and that signal reaches down to a certain level in a hierarchy (e.g., IP core), then such a signal marking (or action thereof) may be recorded as a case_analysis constraint at both the SoC level and the certain IP level, as well. Similarly, if a user applies a waiver, and the waiver is contained inside a given IP only, the waiver may be recorded as an IP-level waiver also by appropriately modifying the hierarchical names, according to some embodiments.

When a new design is run through static verification, a tool may scan the design and check whether the full design, or any parts of the design, may appear similar to designs saved in database. The similarity matching is not necessarily exact, but may instead be triggered upon a certain degree of correlation of features of a given design, including at a hardware-description level. Correlation of features may be reflected by a similarity index, which may reflect any level of transformations as applied to vectorized features extracted from a given design. ML techniques may be used as further facilitating identification of similar designs.

When a DUT and another existing design have overlapping features, such as with respect to other designs in a given hardware project and/or with respect to other designs in a reference data store (e.g., a library and a database), the DUT and existing design with overlapping features may be considered to be similar. This overlap may occur when a design is copied in one or more instances, and a component is modified, while other components remain unmodified. Such copying and modification may be found in designs, according to some embodiments, containing or referencing other known designs, such as reusable design templates for various elements (e.g., an SoC, an IP core, and other circuitry) or other already-modified derived designs or the like. Thus, similar designs are not identical to each other, but they may have certain features in common. Static verification, when performed on such similar designs, may therefore benefit from having certain test-tool attributes or actions propagated automatically from one design element to a similar design element.

Once similar design components are identified, a recommender may be used, according to some embodiments, to recommend accumulated attributes or actions stored in a database. The present static verification system may allow a user to accept or reject a recommendation manually, for example, in some implementations, as opposed to having recommendations be automatically applied, in other embodiments.

Some potential issues and problems to solve may be identified by way of example below. When a design goes through static verification (e.g., lint, CDC, RDC, and/or LP, among other options), one example workflow from testing to signoff may proceed as follows:

A user (engineer) may change a design of a hardware element in order to remedy an underlying issue causing any given violation(s), such as a bug fix. The user may fix a specific design issue identified by the violation, e.g., with respect to hardware description, register-transfer level (RTL) logic, and/or netlist representations, or by any other means for remedying an underlying design to address a violation.

Additionally, or alternatively, in some use cases, an issue triggering a violation may be addressed in meta-design data, such as by changing test or design specifications such as in Unified Power Format (UPF), such as per Institute of Electrical and Electronics Engineers (IEEE) Standard IEEE 1801, to name a non-limiting example. Other test attributes, such as constraints (C), settings (S), waivers (W), or other tool configurations, may also address violations without necessarily altering an underlying hardware design.

In some use cases, a user, program, or other entity may specify new or additional constraints in a given static-verification tool to address a given violation raised by that tool. A user may set and/or apply a set case_analysis parameter to specify at least one constraint in which a net is assumed constant (e.g., fixed at 0 or 1 for purposes of testing) at a particular design node, to name one example of C.

In some use cases, the user, program, or other entity may apply a tool setting or similar configuration option to tune or configure tests such as static analysis and/or verification based on a given design style. As an example of S, a user may apply a setting, e.g., set app_var handle hanging_crossover=true, to specify for a given test tool how to handle a hanging node in a given design, such as for tests running LP analysis with respect to any nodes without a load or a driver, for example.

In some use cases, a user, program, or other entity may apply waivers to violations, in order to disregard a particular violation or class of violations. This approach may not directly address an underlying design issue, but can make a given violation go away from a given test result, often at the discretion of a user or project manager for purposes of signoff.

While design practices may favor constraints or settings over waivers, tools may handle any of these test attributes (C, S, W) arbitrarily as instructed. However, conventional tools fail to handle propagation of such attributes across derivative design elements, such as those derived from hardware design elements reused across a design hierarchy, for example.

Changes to attributes such as C, S, and W, may go poorly managed by design teams manually, for example, and electronic design automation (EDA) tools may not propagate attributes usably to a subsequent version of the hardware design as part of design collateral (e.g., non-RTL representations or metadata) in many cases. This disconnect or shortcoming in conventional techniques may result in duplication of work, errors, and delays in signoff completion for hardware designs and related projects. The present systems and methods, among other embodiments disclosed herein, address these issues and provide solutions, according to some example embodiments.

FIG. 1 illustrates saving of constraints, settings, and waivers for various design levels, according to some embodiments of the present disclosure. As shown, the depiction of FIG. 1 shows an example flow of saving attributes or actions performed on the design. Here, from the design's top level (top 102), may be saved in a corresponding data store, database, or database entry (top database 124) that may include constraints (C), settings (S), waivers (W), or any combination thereof, among other possible records or fields, for example. In an embodiment, C, S, and W used to run a test on top 102 may be saved in top database 124, so that if top 102 or corresponding description may be used later in some other design, then C, S, and/or W from top database 124 may be reused as available for later tests of hardware-design elements similar to top 102.

However, saving such test attributes or actions only at top design level may not be sufficient to achieve desired gains in efficiency. Even if the same design may not be reused as an exact copy in another instance or level of hierarchy, that parts of that same design may be reused in different structural or functional contexts, and in other levels of a design hierarchy, such as chiplet level or IP block level, in some use cases, in different parts of a given SoC design, for example.

Derived designs may involve changes such as replacing some IPs with newer version while other IPs may be left to remain the same as before, using one or more additional copies of the same IP (e.g., using multiple identical central processing unit (CPU) cores or deriving variations of the same CPU cores), using new IPs that may have different functionality or that add new functionality while other IPs remain the same, or employing a combination of the above, to name a few non-exhaustive and non-limiting example use cases.

Accordingly, the present techniques as disclosed herein include, by way of illustrative examples for description, show how test attributes or actions may be applied at an SoC level or full-chip level, and, as needed or desired for a given level of reliability and efficiency, propagate applicable actions to lower-level design elements in a design hierarchy (e.g., at a chiplet level, and at an IP level).

Propagation of Constraints

Propagation of constraints may also be considered as constraint characterization. A few non-limiting examples are provided below.

Using set case_analysis, a net or port may be marked as assume-constant and then propagated down to a lower level of design hierarchy. If a case-analysis constraint reaches an IP boundary, the constraint may also be saved in an IP database or data store, according to some embodiments.

Additionally, or alternatively, quasi_static CDC constraints may be specified at a top level of a design. If a given signal reaches an IP boundary without going through any multi-input gate, then the quasi_static CDC constraints may also be saved in an IP database as well, for example. Similarly, in some use cases, where a specified clock signal reaches an IP boundary, a corresponding clock constraint may be saved in an IP database, according to some embodiments.

Propagation of Settings or Other Configuration Options

Tool settings and configurations may be global in nature, in which case they may be applied within various levels of a design hierarchy. But in some cases, corresponding configuration options may be overridden for specified parts of hierarchy. In such cases, those special configuration overrides may be propagated to subordinate elements lower in the hierarchy, until any point at which the same setting or configuration option may be again overridden. Constraints, like settings or other configuration options, may be propagated in similar fashion.

A few non-exhaustive, non-limiting example configurations may be provided as follows: N-flip-flop synchronizer depth for CDC, control-sync qualifier for CDC (sequential depth down to which another CDC datapath can be propagated for synchronization), how to handle hanging nets for low-power analysis, whether to check for diode violations, whether memory blocks are to be considered separately for RDC analysis, etc.

Propagation of Waivers

Before, during, or after analysis, a user may wish to waive certain violations or classes thereof, thus applying at least one waiver. Reasons for waiving may vary, e.g., a specific design style not understood by the tool or otherwise mishandled by the tool, or the violations may be harmless in the given environment, etc. Subsequent runs of the same test for the same design then may not show these same violations, thus reducing an amount of "noise" (undesired or unhelpful violations) that may be reported to the user, according to some use cases.

Waivers may be applied in a context of a current SoC, or may be contained in a specific IP or specific branch of a design hierarchy at a level below a top design level, for example. At a top level, or within specific lower-level branches, waivers may also be propagated in similar fashion as with constraints, settings, and/or other configuration options as described elsewhere herein.

Figure 2:
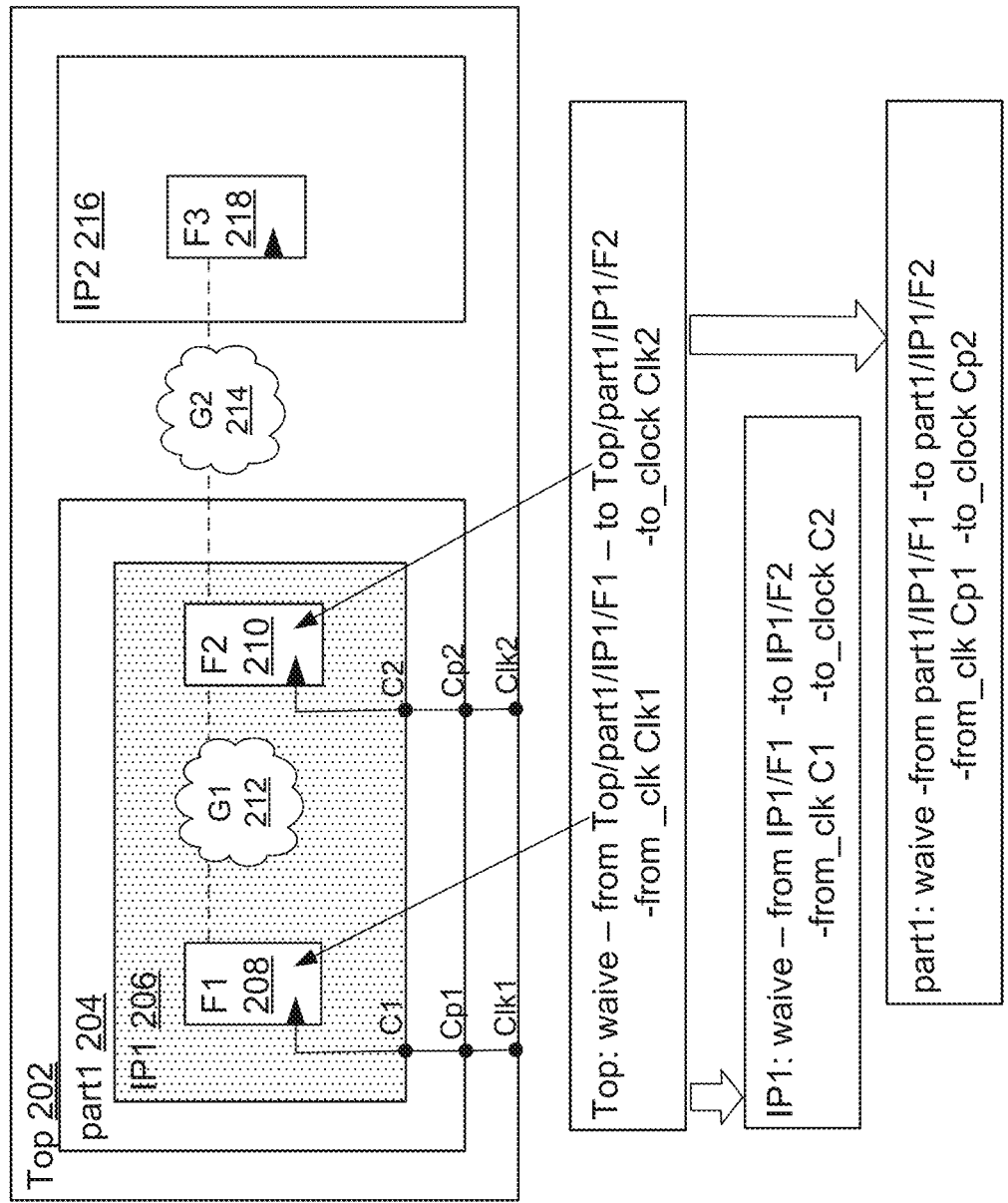
FIG. 2 illustrates propagation of a waiver from a top level of a hierarchy to a lower level of the hierarchy, according to some embodiments of the present disclosure.

FIG. 2 illustrates propagation of a waiver from a top level of a hierarchy to a lower level of the hierarchy, according to some embodiments of the present disclosure. While a waiver is shown in the particular example of FIG. 2, other attributes (e.g., constraints, settings, or other configuration options) may be propagated in similar fashion as appropriate.

In FIG. 2, an example is shown as to how a waiver is applied in Top 202, at a relative top level of a design hierarchy, where the waiver may be propagated or ported to lower-level IP blocks, in an embodiment. In the example shown, the waiver may operate on design elements completely contained inside IP1 206, for example, including functional elements such as specific flip-flops F1 208 and F2 210, and other arbitrary logic or gate arrays, e.g., G1 212. While SoC-level test attributes may also be propagated to other elements, e.g., G2 214 and IP2 216 (including F3 218), attributes specific to IP1 206 may not necessarily correspond to IP2 216 or F3 218, for example.

As also shown in FIG. 2, clock signals at the SoC level may be traced back to a given IP level, e.g., to IP1 206 through a higher-level part1 204 within the same relative top level of the design hierarchy (Top 202). By such signal traces, corresponding clocks may be identified in a given hardware design or description thereof. Thus, in a case where a waiver is propagated to the IP1 level, the waiver may also be saved (by itself and/or as an action) in a corresponding IP1 database, e.g., IP1 database 122 or IP1 database 422, as shown in FIGS. 1 and 4, respectively, and may also be saved or ported to a corresponding part1 database, analogous to blk1 database 120 of FIG. 1, corresponding to blk1 104 of FIG. 1 and part1 204 of FIG. 2, for example.

As shown in FIG. 1, where other elements have respective corresponding databases as shown, e.g., top database 124 corresponding to top 102, IP2 database 126 corresponding to IP2 114 and IP2 118, blk2 128 corresponding to blk2 110; FIG. 4 likewise shows additional databases corresponding to the additional classes of similar design elements, reused or otherwise. For example, newtop database 424 corresponds to newtop 402, at least by virtue of having different design elements as components deeper in the contained design hierarchy.

Figure 4:
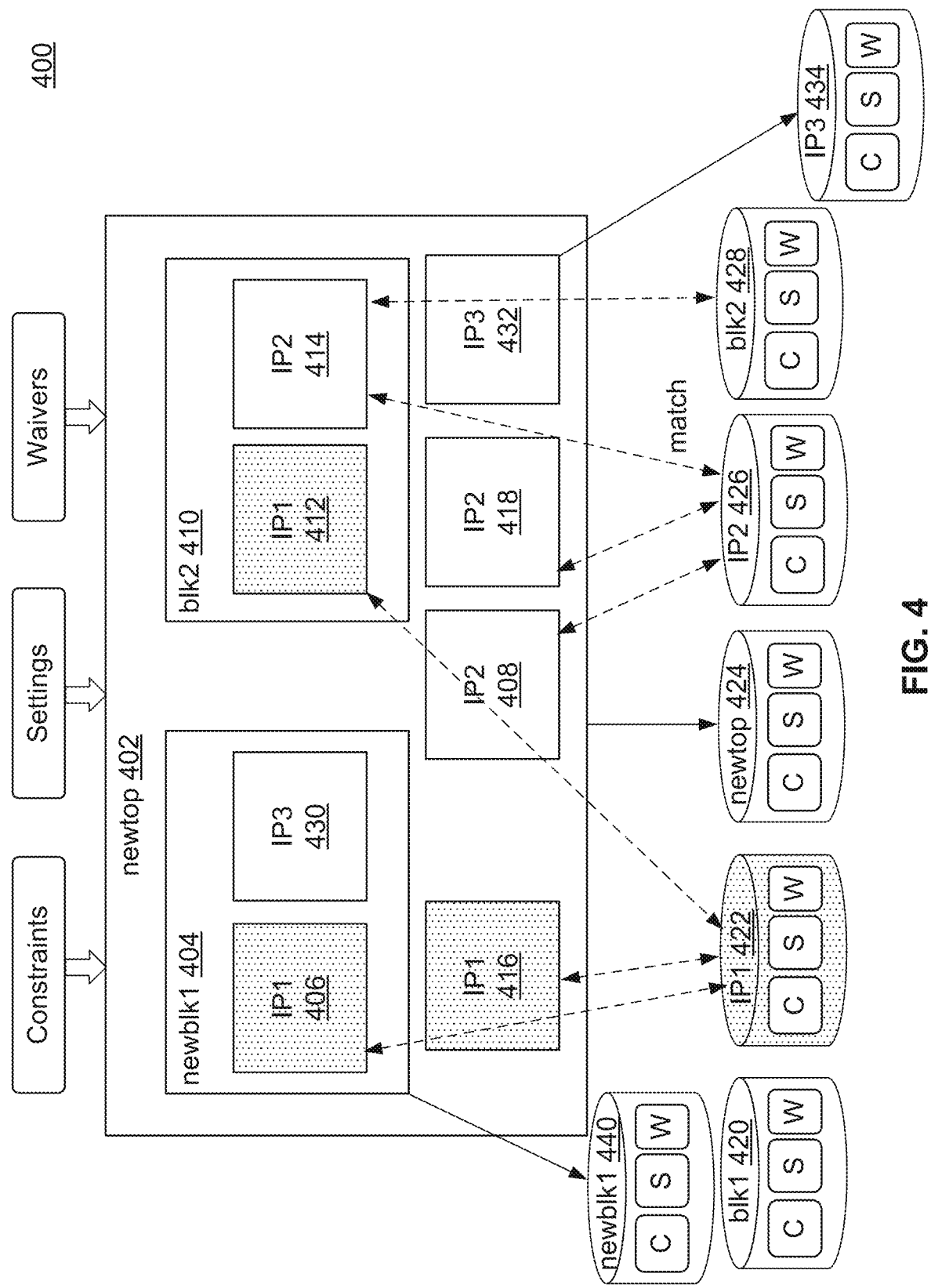
FIG. 4 illustrates depicts derived version of the design of FIG. 1, with some modification, according to some embodiments of the present disclosure.

Similarly, newblk1 database 440 corresponds to newblk1 404, which replaces blk1 104 of FIG. 1 (corresponding database blk1 database 420 no longer applies to this design, as shown by the lack of arrows referencing blk1 database 420 in FIG. 4). Other databases, e.g., IP1 database 422, IP2 database 426, and blk2 database 428 of FIG. 4 likewise correspond to IP1 database 122, IP2 database 126, and blk2 database 128 of FIG. 1. The IP3 database 434 newly corresponds to IP3 432 and IP3 430 (arrow not shown between IP3 database 434 and IP3 430 where applicable, assuming no attributes or actions are overridden).

In some use cases, not all waivers may be ported to lower levels. For example, some waivers not fully contained inside a given hierarchy may not be ported to lower-level elements within related hierarchies. An example of this use case is shown in FIG. 3.

Figure 3:
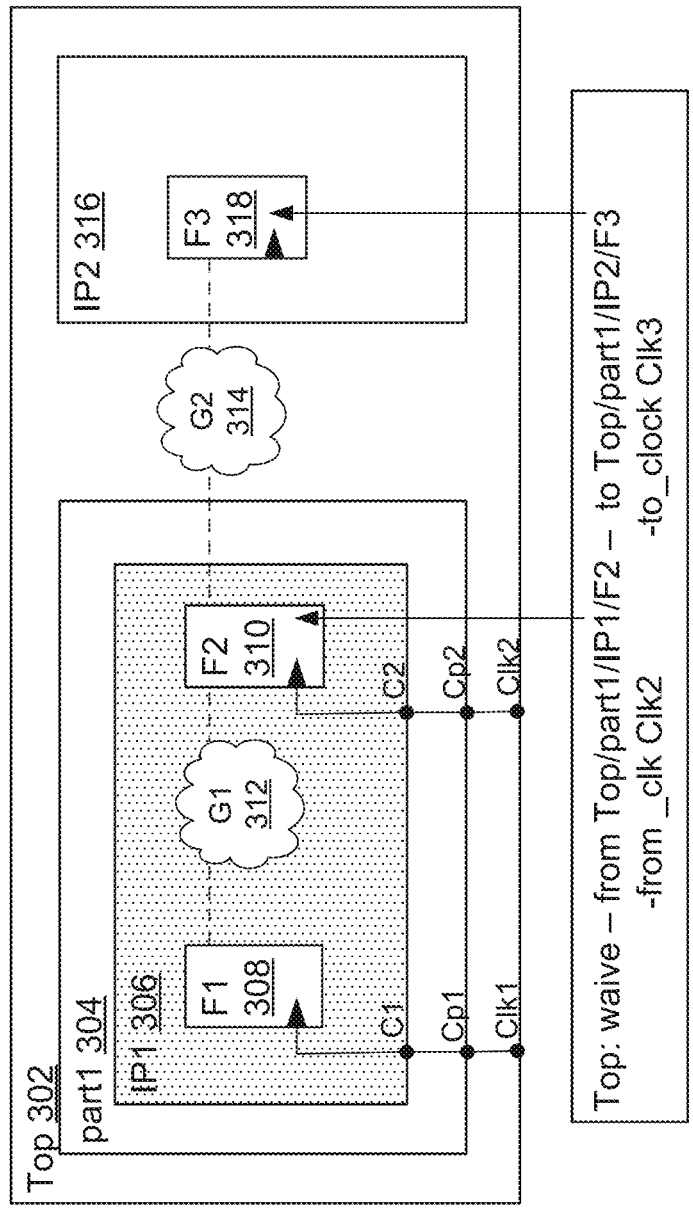
FIG. 3 illustrates non-propagation of a waiver from a top level of a hierarchy to a lower level of the hierarchy, according to some embodiments of the present disclosure.

FIG. 3 illustrates non-propagation of a waiver from a top level of a hierarchy to a lower level of the hierarchy, according to some embodiments of the present disclosure. In this non-limiting example embodiment, depicted is a waiver that spans two hierarchies. Because this waiver is contained only in one hierarchy, it is not necessarily propagated to lower-level elements within either hierarchy, according to this use case as shown.

While the waiver is different between FIG. 3 and FIG. 2, the hardware-design elements are otherwise analogous, e.g., with Top 302 corresponding to Top 202, part1 304 corresponding to part1 204, IP1 306 corresponding to IP1 206, IP2 316 corresponding to IP2 216, and so on for F1 308 to F1 208, F2 310 to F2 210, G1 312 to G1 212, G2 314 to G2 214, and F3 318 to F3 218. The similarities and differences between FIG. 3 and FIG. 2 thus serve to illustrate different propagation rules for different attributes, in some use cases.

For a given design hierarchy attributes and/or actions may be saved. Additionally, or alternatively, a signature may be derived or generated based at least in part on the content of the hierarchy, and saved alongside or in lieu of other representations of attributes or actions, according to some embodiments.

For some implementations, the signature may be computed using a hash function. For some database embodiments, the signature may serve as a key value to reference data corresponding to a given representation of an attribute and/or action.

In further embodiments, any attributes, actions, and/or signatures may be omitted from databases in which design modules are not reused or are otherwise marked as unlikely for reuse, e.g., by a user, program, or other entity.

A sub-design or sub-element may be instantiated multiple times, and propagated attributes or actions for corresponding instances may be accumulated or otherwise aggregated. For example, IP1 is instantiated three times as shown by corresponding rectangles in FIG. 1 (e.g., IP1 106, IP1 112, and IP1 116), Propagated attributes or actions from these three instances are shown as being accumulated and recorded in a database of attributes or actions for IP1 (IP1 database 122), as indicated by corresponding arrows in FIG. 1.

Priority of an attribute or action may be increased in accordance with more instances having a given attribute or action, for example. In a particular use case, if an attribute or action is applied to all instances of a given reused design element, then that attribute or action may be assigned highest priority relative to other attributes or actions.

In an example test workflow for ML-based static verification of hardware-design elements, a run of the testing tools may be started, e.g., by a user, program, or other entity, with respect to a new version of an existing design, where the new version includes derivative elements derived from (modifying some elements of) the original existing design.

Further, where actions may have been taken with respect to a previous design, certain parts of the new design may be identified that remain unchanged (or sufficiently similar, as may be determined with ML assistance) with respect to the previous design. For those identified parts, the same attributes or actions from a corresponding previous test may be retrieved from the database and/or recommended to be applied to the new design. Recommendations for actions or attributes may also be generated with ML assistance, as with other recommendation engines processing database entries for recommendation, for example.

FIG. 4 illustrates depicts derived version of the design of FIG. 1, with some modification, according to some embodiments of the present disclosure. The new design newtop 402 may be regarded as a modified version of the design top 102 shown in FIG. 1. Compared to design 100 of FIG. 1, design 400 of FIG. 4 includes the following changes: blk1 104 of FIG. 1 is replaced by newblk1 404, which contains IP3 430 instead of IP2 108, while blk2 110 and IP2 118 are reused as-is (blk2 410 and IP2 416), as shown in FIG. 4. An additional instance of IP2 408 is shown, as well as an additional instance of IP3 432, in the top level (newtop 402) not within other design-element blocks.

Using at least a saved or computed signature of a design element the design hierarchy, and machine learning, in some embodiments, reused or derived parts of a given design under test (DUT), etc., may be identified as being the same or sufficiently similar to elements of a previous design. For example, IP1, IP2, and blk2 may be identified as having remained the same across design 400 of FIG. 4 and/or across a previous design, e.g., design 100 of FIG. 1. Similarly, new design hierarchies that may exist in a derived version, e.g., IP3 430, 432, and newblk1 404, may have attributes or actions propagated and saved in a similar manner, as described elsewhere herein. Any matching and propagation (e.g., as shown by broken-line arrows in FIG. 4) may further be assisted by machine learning, as also described elsewhere herein.

For the matched hierarchy, saved attributes or actions may be recommended. In some embodiments, attributes, actions, and/or recommendations may be sorted by priority, for example. For some use cases, attributes or actions may be applied when accepted or selected by a user (e.g., engineer, manager) presented with such recommendations in response to reporting of violations, in some embodiments. Moreover, recommended attributes or actions accepted by a user may be fed back to a corresponding database, and may further result in a corresponding priority value being incremented, for example.

Figure 5:
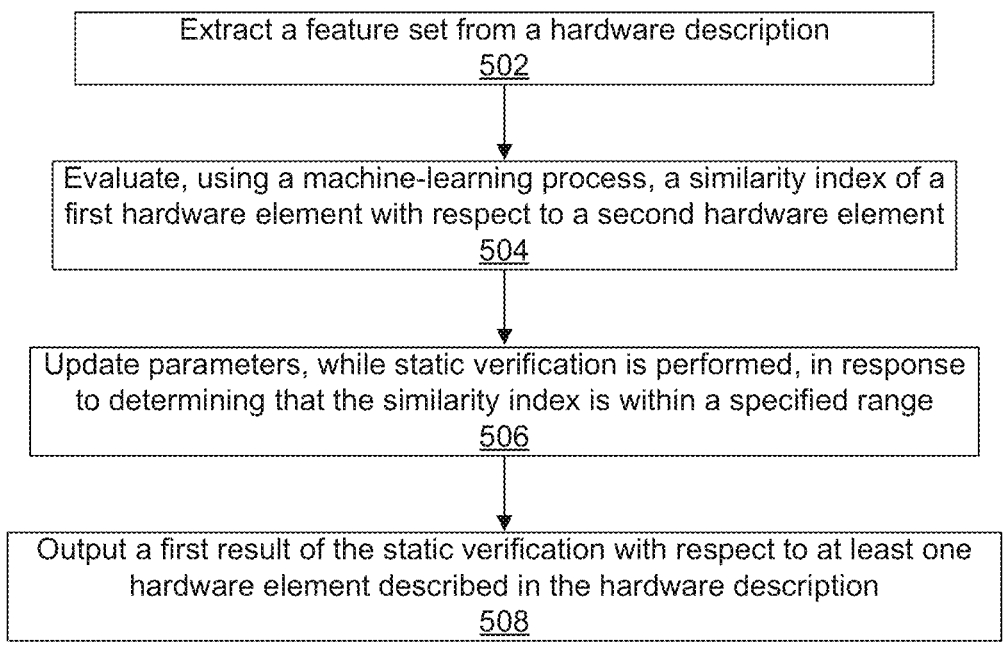
FIG. 5 illustrates a flowchart of an example method of static verification, according to some embodiments of the present disclosure.

FIG. 5 is a flowchart illustrating a method 500 for operation of the ML-based techniques for static verification for derived hardware-design elements described herein, according to some embodiments. Method 500 may be performed by processing logic that may include hardware (e.g., circuitry, dedicated logic, programmable logic, microcode, etc.), software (e.g., instructions executing on a processing device), or a combination thereof.

Method 500 shall be described with reference to FIGS. 5, 7, and 8. However, method 500 is not limited only to those example embodiments. The steps of method 500 may be performed by at least one computer processor coupled to at least one memory device. An example processor and memory device(s) are described below with respect to FIG. 8. In some embodiments, method 500 may be performed by components of systems shown in FIGS. 7 and 8, or any combination thereof, which may further include at least one processing device and memory such as those of FIG. 8.

In 502, memory 804 and at least one processor (e.g., processing device 802) may be configured (e.g., by instructions 826) to extract a feature set from a hardware description, according to some embodiments. As noted elsewhere herein, features may correspond to any parts of a design or description thereof, and may be represented as values in vectorized representations, such as may form a vectorized feature set, for example.

As also noted elsewhere herein, features of a hardware design or description may correspond to any number of wires, signals, ports, inputs/outputs, gates, etc.; or any relative or absolute configuration thereof, e.g., different logical ordering or connection. Such features may be evaluated (as per 504) to determine correlation, such as for purposes of similarity indexing, among other use cases.

Moreover, in some embodiments, the feature set may be based at least in part on at least one attribute of the hardware description, wherein the at least one attribute corresponds to one or more hardware elements of the hardware description, and wherein the at least one attribute includes a configuration, a setting, a constraint, or a waiver of one or more violations of a specification for the static verification. At least one attribute of the first hardware element is propagated to at least one other hardware element in a hierarchy of hardware elements described in the hardware description and for which the similarity index is within the specified range, per some example use cases.

Additionally, for purposes of 502, to extract a feature set, as described here, may include computing appropriate vector values, tensors, or other data, etc., based on an analysis of a hardware description, for example. In other embodiments, additionally, or alternatively, to extract a feature set may include retrieving the feature set from a data store, in whole or in part, where the feature set or relevant part thereof has been previously extracted by analysis of equivalent or similar hardware descriptions, for example.

In 504, processing device 802 may be configured to evaluate, via a machine-learning process having input including the feature set, a similarity index of a first hardware element with respect to a second hardware element, where the first hardware element is described in the hardware description, according to some embodiments.

Algorithms for the evaluation of 504 may include ML processes for matching similar designs or descriptions thereof. Additional ML processes may include hashing algorithms to generate signatures of descriptions, such as of hardware elements, in whole or in part. For example, representations of input/output (I/O) ports, pins, wires, gates, etc., may be stored lexicographically, and signatures may be hashed numerical representations of these lexicographic representations, in some embodiments.

Additionally, or alternatively, signatures may themselves be unique lexicographic representations of hardware elements. Similarity detection may operate on the signatures and/or lexicographic representation, using algorithms suited for determining similarity, e.g., cross-correlation, peak similarity, root-mean-square measures, and/or ML techniques including similarity learning by regression, classification, ranking, or locality-sensitive hashing (LSH), fuzzy matching of attributes, descriptions, or signatures, etc., to name a few non-limiting examples.

Moreover, RTL image-creation techniques may be used in conjunction with image comparison to determine similarity between RTL images of DUT elements and known elements of original or reused designs from which derivative designs are derived, for example. Such comparisons may be performed hierarchically so that even if a full design is not similar, any parts of the design hierarchy that may be similar to other known design modules seen earlier may thus be detected as similar. A result may be an identification of a similar design element, within a specified threshold of a similarity index, which may be determined by any of the numeric, lexicographic, or other equivalent algorithms such as those described elsewhere herein.

The similarity index may be calculated, among other possible ways, from various transforms, comparisons, weighted averaging, etc., of features from the feature sets corresponding to any two or more hardware elements. In some embodiments, parts of hardware elements or corresponding descriptions (e.g., modules, submodules, functional descriptions, or other structural elements) may be compared, matched, classified, and/or evaluated across different hardware elements, for example.

Additionally, or alternatively, in some embodiments, a same design element may be identified by structural or functional equivalency checks, for example. Even if different instances of hardware description are not an exact match, such as with derived designs (e.g., derivative elements based on reused elements), there may be certain parts of a first description that match or resemble other parts present in a second description, for example. Such descriptions may vary in ways that may not significantly affect compiled output (e.g., comments, names of elements such as wires, signals, ports, inputs/outputs, gates, etc.).

In another sense, such descriptions may vary in ways that may result in relatively small variations of compiled output based on a derived design (e.g., different number of wires, signals, ports, inputs/outputs, gates, etc.; or a modified configuration thereof, e.g., different logical ordering or connection), while still maintaining some of the structure or function of an original design from which a derivative hardware element is derived.

A similarity index may increase based on a number (absolute or relative) of like features across multiple hardware elements or descriptions thereof. Like features may include features that are identical (equal or otherwise equivalent) in some respects, or that may be within a given range set as sufficient to establish similarity for a given value, feature, or preponderance of values or features. At least one similarity index may be applied to one or more parts of a given hardware element, collectively, to multiple parts as a whole, to specific hardware elements or descriptions thereof (absolute or relative within each description or element), or to any combination thereof.

In some embodiments, a similarity index may be calculated by deterministic logic, algebraic and/or relational operators, statistical analysis, or other such operations. Additionally, or alternatively, evaluation of any given similarity index may be enabled, facilitated, and/or enhanced by ML processing as described elsewhere herein.

In 506, processing device 802 may be configured to update parameters corresponding to a static verification of the hardware description while the static verification is being performed, in response to determining that the similarity index is within a specified range. To update the parameters of the static verification, processing device 802 may transform, modify, or otherwise provide one or more specific test attributes or actions applicable to a given hardware element (e.g., SoC, chiplet, IP, or subelement), where the provided actions or attributes correspond to a different hardware element, for example, that has a similarity index within a predetermined range. Corresponding test attributes or actions may be applied automatically or upon selection of recommended attributes or actions, e.g., by a user. The range may be set in accordance with preferences of a user or end-user, system parameters, or other considerations on the part of the user, manager, partner, or other relevant third party, for example. Similarly, in some embodiments, the range may correspond with priority values for attributes, actions, or design elements, etc., as described elsewhere herein.

In some embodiments, the updating and corresponding transformation of 506 may apply to the same test types and algorithms for a given static verification, for example, modifying a selected set of test attributes corresponding a given hardware design element for the given static-verification test, while the given test is being performed, or between discrete phases of the given test, for example The transformation of 506 may be made using any logical or relational operator(s), for example, with respect to any endpoint or other value within the predetermined range. Other conditional operators may also be applied, depending on other parameters of interest. Additionally, or alternatively, machine-learning or other processes that may be the same as, equivalent to, or similar to those of the evaluation of 504 may further factor into, facilitate, or otherwise enhance the parameter updates of 506 and any constituent functions or transforms thereof, according to some embodiments.

In 508, processing device 802 may be configured to output a first result of the static verification with respect to at least one hardware element described in the hardware description. Output may be in the form of a violation report, for example. Additionally, or alternatively, the output may accompany a recommendation of an attribute to be applied or an action to be taken with respect to a given hardware-design element under a given static-verification test, for example.

In an embodiment, a violation report or recommendation therein may include a notification that the first attribute of the first hardware element is similar to the second attribute of the second hardware element, a notification that the second result is returned as the first result with respect to the first hardware element, an option to modify the first hardware element, an option to substitute the first hardware element with the second hardware element, an option to run the check of the first hardware element with respect to the specification using the first attribute instead of the second attribute, an option to run the check of the first hardware element with respect to the specification using a third attribute, or a combination thereof. Additional options may be included in further embodiments; the examples listed herein are for illustrative purposes and are not specifically limiting.

Together, or separately, other configuration options, such as constraints, settings, or waivers, may be applied with respect to any element (e.g., any corresponding hardware description) for purposes of a given test (e.g., any variety of static verification procedures). Further examples of constraints, settings, waivers, or other configuration options, etc., may be included, and are described in further detail elsewhere herein.

Any or all of the above steps may be performed as part of embodiments as shown and described further above with respect to FIGS. 1-4 and/or 6-8, in some embodiments. Additionally or alternatively, any or all of the above steps may be performed as part of processing demonstrated in FIGS. 5 and/or 6, for example.

Not all steps of method 500 may be needed in all cases to perform the present techniques disclosed herein. Further, some steps of method 500 may be performed simultaneously, or in a different order from that shown in FIG. 5, as will be understood by a person of ordinary skill in the art.

FIG. 6 is a flowchart illustrating a method 600 for operation of the ML-based techniques for static verification for derived hardware-design elements described herein, according to further embodiments in addition to those shown in FIG. 5 with method 500. Method 600 may be performed by processing logic that may include hardware (e.g., circuitry, dedicated logic, programmable logic, microcode, etc.), software (e.g., instructions executing on a processing device), or a combination thereof.

Method 600 shall be described with reference to FIGS. 5-8. However, method 600 is not limited only to those example embodiments. The steps of method 600 may be performed by at least one computer processor coupled to at least one memory device. An example processor and memory device(s) are described below with respect to FIG. 8. In some embodiments, method 600 may be performed by components of systems shown in FIGS. 7 and 8, or any combination thereof, which may further include at least one processing device and memory such as those of FIG. 8.

In 602, memory 804 and at least one processor (e.g., processing device 802) may be configured (e.g., by instructions 826) to check at least one corresponding signature of at least one attribute of the at least one hardware element described in the hardware description with respect to the second hardware element, wherein the second hardware element corresponds to a known signature of at least one known attribute of at least one known hardware element referenced in a database or at least one other hardware element described in the hardware description, in some embodiments. Examples of such checking, including comparing, matching, recommending, and other options by ML-assisted processes, are described further elsewhere herein.

In 604, processing device 802 may be further configured to omit, in response to 602, from the extracting 502, the evaluating 504, or the static verification 506, a given hardware element of the at least one hardware element the hardware description, according to some embodiments. A given signature of the given hardware element at least partially matches the known signature of the second hardware element, as described in further detail elsewhere herein.

Any or all of the above steps may be performed as part of embodiments as shown and described further above with respect to FIGS. 1-5 and/or 7-9, in some embodiments. Additionally or alternatively, any or all of the above steps may be performed as part of processing demonstrated in FIGS. 5 and/or 6, for example.

Not all steps of method 500 may be needed in all cases to perform the techniques disclosed herein. Further, some steps of method 500 may be performed simultaneously, or in a different order from that shown in FIG. 5, as will be understood by a person of ordinary skill in the art.

Figure 7:
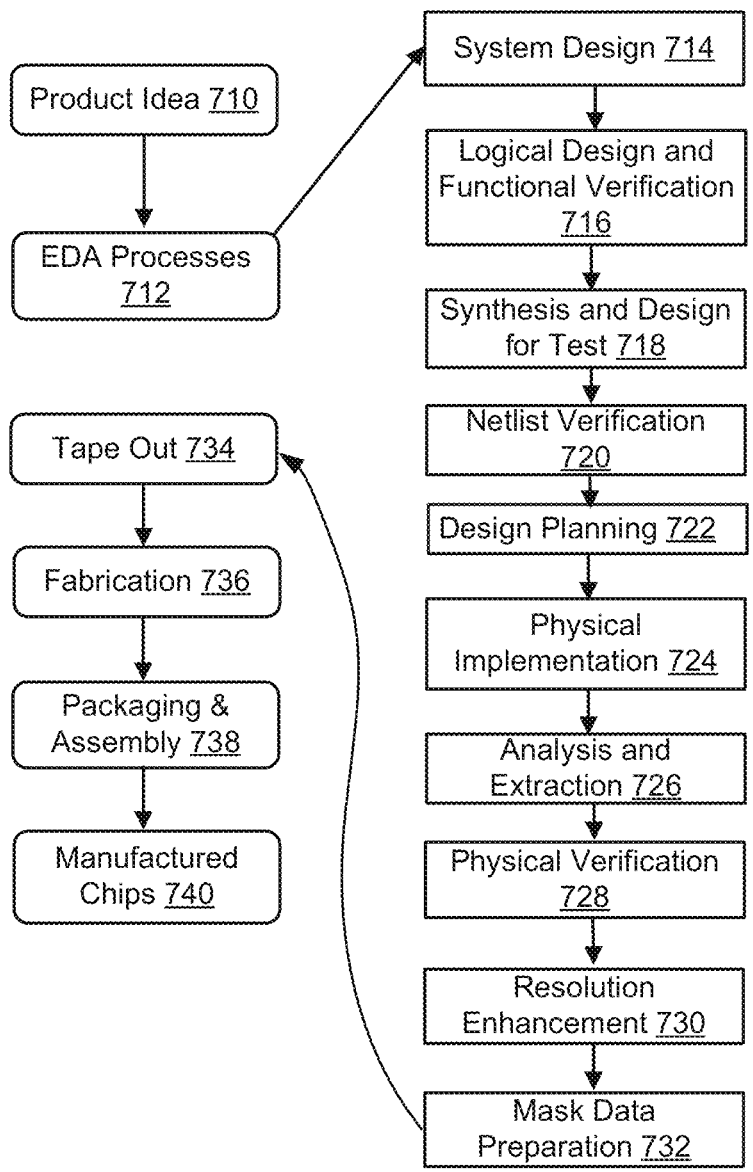
FIG. 7 depicts a flowchart of various processes used during the design and manufacture of an integrated circuit, according to some embodiments.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register-transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
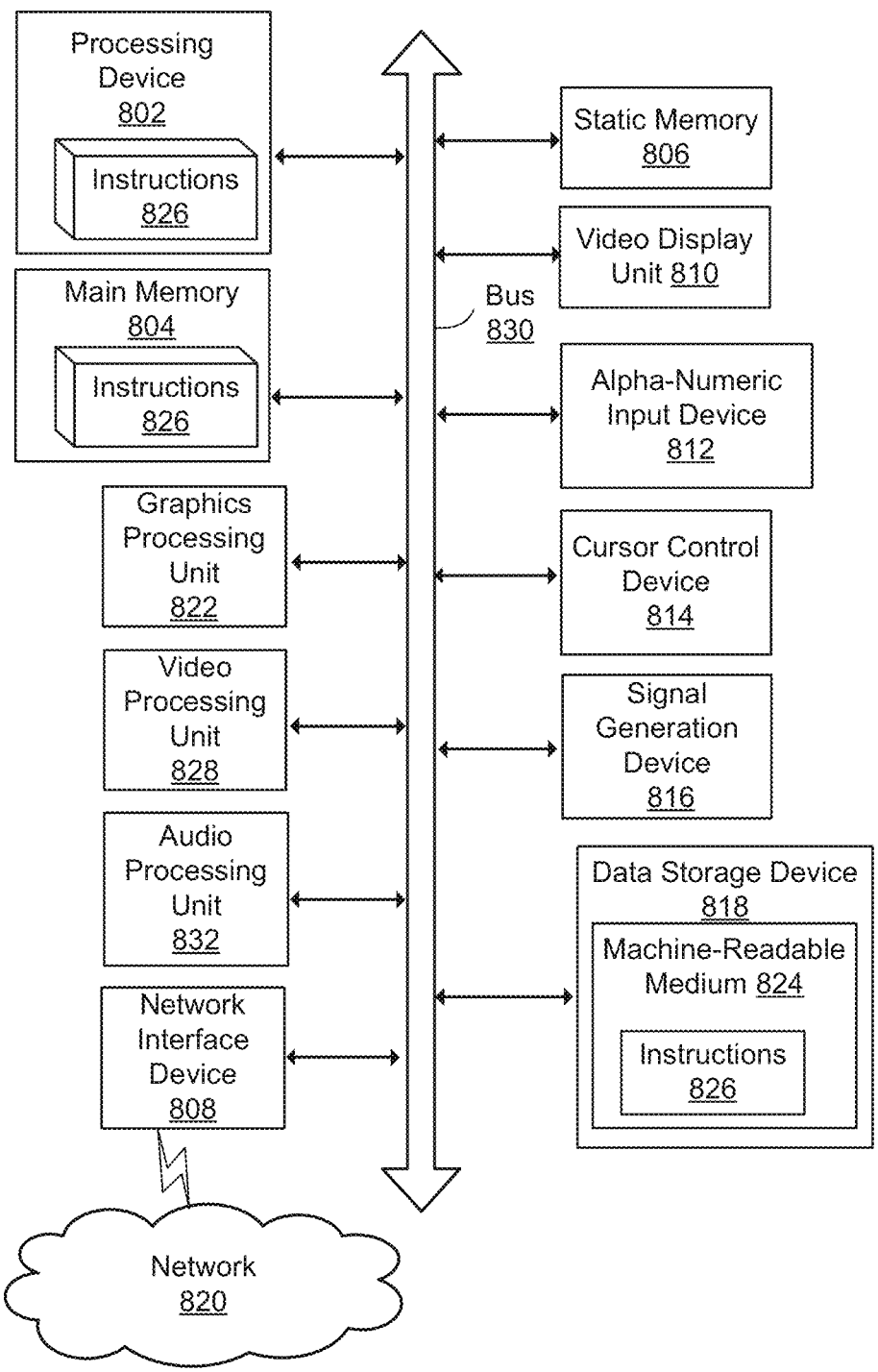
FIG. 8 depicts an abstract diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A computer-implemented method, comprising:
    extracting a feature set from a hardware description;
    evaluating a similarity index of a first hardware element with respect to a second hardware element, using a machine-learning process based on the feature set, wherein the first hardware element is described in the hardware description;
    updating via the at least one processor, one or more parameters corresponding to a static verification of the hardware description while the static verification is being performed, by providing at least one test attribute, corresponding the second hardware element, applicable to the first hardware element, in response to determining that the similarity index is within a specified range; and
    outputting a first result of the static verification with respect to at least one hardware element described in the hardware description.

2. The computer-implemented method of claim 1, wherein the feature set is based at least in part on the at least one test attribute corresponding to one or more hardware elements of the hardware description, and wherein the at least one attribute comprises a configuration, a setting, a constraint, or a waiver of one or more violations of a specification for the static verification.

3. The computer-implemented method of claim 2, wherein the at least one test attribute of the first hardware element is propagated to at least one other hardware element in a hierarchy of hardware elements described in the hardware description and for which the similarity index is within the specified range.

4. The computer-implemented method of claim 1, wherein the transforming comprises:
    identifying a specification for the static verification;
    indicating based at least in part on the similarity index and on the specification, that a first attribute of the first hardware element is similar to a second attribute of the second hardware element;
    retrieving a second result of an additional static verification with respect to the second hardware element and the specification, using the second attribute instead of the first attribute; and
    returning the second result as the first result with respect to the first hardware element.

5. The computer-implemented method of claim 4, wherein the returning the second result returned as the first result with respect to the first hardware element comprises generating, for at least one user of the static verification, via the at least one processor, a report comprising: a notification that the first attribute of the first hardware element is similar to the second attribute of the second hardware element, a notification that the second result is returned as the first result with respect to the first hardware element, an option to modify the first hardware element, an option to substitute the first hardware element with the second hardware element, an option to run the check of the first hardware element with respect to the specification using the first attribute instead of the second attribute, an option to run the check of the first hardware element with respect to the specification using a third attribute, or a combination thereof.

6. The computer-implemented method of claim 1, further comprising:
    checking at least one corresponding signature of at least one attribute of the at least one hardware element described in the hardware description with respect to a known signature of at least one known attribute of the second hardware element, wherein the second hardware element corresponds to at least one known hardware element referenced in a database or at least one other hardware element described in the hardware description; and
    in response to the checking, omitting from the extracting, the evaluating, or the static verification, a given hardware element of the at least one hardware element the hardware description, wherein a given signature of the given hardware element at least partially matches the known signature of the at least one known attribute of the second hardware element.

7. The computer-implemented method of claim 1, wherein at least one of the evaluating, the determining, or the static analysis, is performed for a specified level of a hierarchy of hardware elements described in the hardware description.

8. A non-transitory computer-readable storage medium storing instructions that, when executed by at least one processor, cause the at least one processor to perform operations comprising:
    extracting a feature set from a hardware description;
    evaluating a similarity index of a first hardware element with respect to a second hardware element, using a machine-learning process based on the feature set, wherein the first hardware element is described in the hardware description;
    updating one or more parameters corresponding to a static verification of the hardware description while the static verification is being performed, by providing at least one test attribute, corresponding the second hardware element, applicable to the first hardware element, in response to determining that the similarity index is within a specified range; and
    outputting a first result of the static verification with respect to at least one hardware element described in the hardware description.

9. The non-transitory computer-readable storage medium of claim 8, wherein the feature set is based at least in part on the at least one test attribute corresponding to one or more hardware elements of the hardware description, and wherein the at least one attribute comprises a configuration, a setting, a constraint, or a waiver of one or more violations of a specification for the static verification.

10. The non-transitory computer-readable storage medium of claim 9, wherein the at least one test attribute of the first hardware element is propagated to at least one other hardware element in a hierarchy of hardware elements described in the hardware description and for which the similarity index is within the specified range.

11. The non-transitory computer-readable storage medium of claim 8, wherein the transforming comprises:
    identifying a specification for the static verification;
    indicating based at least in part on the similarity index and on the specification, that a first attribute of the first hardware element is similar to a second attribute of the second hardware element;
    retrieving a second result of an additional static verification with respect to the second hardware element and the specification, using the second attribute instead of the first attribute; and
    returning the second result as the first result with respect to the first hardware element.

12. The non-transitory computer-readable storage medium of claim 11, wherein the returning the second result returned as the first result with respect to the first hardware element comprises generating, for at least one user of the static verification, via the at least one processor, a report comprising: a notification that the first attribute of the first hardware element is similar to the second attribute of the second hardware element, a notification that the second result is returned as the first result with respect to the first hardware element, an option to modify the first hardware element, an option to substitute the first hardware element with the second hardware element, an option to run the check of the first hardware element with respect to the specification using the first attribute instead of the second attribute, an option to run the check of the first hardware element with respect to the specification using a third attribute, or a combination thereof.

13. The non-transitory computer-readable storage medium of claim 8, the operations further comprising:
    checking at least one corresponding signature of at least one attribute of the at least one hardware element described in the hardware description with respect to a known signature of at least one known attribute of the second hardware element, wherein the second hardware element corresponds to at least one known hardware element referenced in a database or at least one other hardware element described in the hardware description; and
    in response to the checking, omitting from the extracting, the evaluating, or the static verification, a given hardware element of the at least one hardware element the hardware description, wherein a given signature of the given hardware element at least partially matches the known signature of the at least one known attribute of the second hardware element.

14. The non-transitory computer-readable storage medium of claim 8, wherein at least one of the evaluating, the determining, or the static analysis, is performed for a specified level of a hierarchy of hardware elements described in the hardware description.

15. A system, comprising:
    a memory; and
    at least one processor coupled to the memory and configured to perform operations comprising:
        extracting a feature set from a hardware description;
        evaluating a similarity index of a first hardware element with respect to a second hardware element, using a machine-learning process based on the feature set, wherein the first hardware element is described in the hardware description;
        updating one or more parameters corresponding to a static verification of the hardware description while the static verification is being performed, by providing at least one test attribute, corresponding the second hardware element, applicable to the first hardware element, in response to determining that the similarity index is within a specified range; and
        outputting a first result of the static verification with respect to at least one hardware element described in the hardware description.

16. The system of claim 15, wherein the feature set is based at least in part on the at least one test attribute corresponding to one or more hardware elements of the hardware description, and wherein the at least one test attribute comprises a configuration, a setting, a constraint, or a waiver of one or more violations of a specification for the static verification; and wherein at least one attribute of the first hardware element is propagated to at least one other hardware element in a hierarchy of hardware elements described in the hardware description and for which the similarity index is within the specified range.

17. The system of claim 15, wherein the transforming comprises:
- identifying a specification for the static verification;
- indicating based at least in part on the similarity index and on the specification, that a first attribute of the first hardware element is similar to a second attribute of the second hardware element;
- retrieving a second result of an additional static verification with respect to the second hardware element and the specification, using the second attribute instead of the first attribute; and
- returning the second result as the first result with respect to the first hardware element.

18. The system of claim 17, wherein the returning the second result returned as the first result with respect to the first hardware element comprises generating, for at least one user of the static verification, via the at least one processor, a report comprising:
- a notification that the first attribute of the first hardware element is similar to the second attribute of the second hardware element, a notification that the second result is returned as the first result with respect to the first hardware element, an option to modify the first hardware element, an option to substitute the first hardware element with the second hardware element, an option to run the check of the first hardware element with respect to the specification using the first attribute instead of the second attribute, an option to run the check of the first hardware element with respect to the specification using a third attribute, or a combination thereof.

19. The system of claim 15, the operations further comprising:
- checking at least one corresponding signature of at least one attribute of the at least one hardware element described in the hardware description with respect to a known signature of at least one known attribute of the second hardware element, wherein the second hardware element corresponds to at least one known hardware element referenced in a database or at least one other hardware element described in the hardware description; and
- in response to the checking, omitting from the extracting, the evaluating, or the static verification, a given hardware element of the at least one hardware element the hardware description, wherein a given signature of the given hardware element at least partially matches the known signature of the at least one known attribute of the second hardware element.

20. The system of claim 15, wherein at least one of the evaluating, the determining, or the static analysis, is performed for a specified level of a hierarchy of hardware elements described in the hardware description.

* * * * *